United States Patent [19]
Morikawa

[11] Patent Number: 5,296,731
[45] Date of Patent: Mar. 22, 1994

[54] SEMICONDUCTOR INTEGRATED CIRCUIT DEVICE WITH ALPHA RAYS RESISTANCE

[75] Inventor: Takenori Morikawa, Tokyo, Japan

[73] Assignee: NEC Corporation, Japan

[21] Appl. No.: 954,698

[22] Filed: Sep. 30, 1992

Related U.S. Application Data

[62] Continuation of Ser. No. 661,438, Feb. 25, 1991, abandoned.

Foreign Application Priority Data

Feb. 27, 1990 [JP] Japan .................................. 2-47685

[51] Int. Cl.[5] ...................... H01L 27/02; H01L 27/04
[52] U.S. Cl. .................................. 257/546; 257/378; 257/499; 257/506; 257/517; 257/552; 257/925
[58] Field of Search ............... 357/43, 48; 257/370, 257/374, 378, 499–520, 546, 549, 552, 925

[56] References Cited

U.S. PATENT DOCUMENTS

| | | | |
|---|---|---|---|
| 4,007,478 | 2/1977 | Yag | 357/43 |
| 4,247,862 | 1/1981 | Klein | 357/23.6 |
| 4,799,098 | 1/1989 | Ikeda et al. | 357/48 |
| 4,937,648 | 1/1990 | Huang | 357/48 |

Primary Examiner—J. Carroll
Attorney, Agent, or Firm—Laff, Whitesel, Conte & Saret

[57] ABSTRACT

A semiconductor integrated circuit device according to the present invention includes a semiconductor layer of a first conductivity type having a high concentration of impurity atoms which layer is formed in or on predetermined locations of a semiconductor substrate with the first conductivity type which locations requires a resistance to alpha rays. The device of the present invention can decrease the amount of the electron collection to a semiconductor layer of a second conductivity type having a high concentration of impurity atoms which layer is separated from the semiconductor layer of the first conductivity type having a high concentration of impurity atoms. Therefore, the semiconductor integrated circuit device of the present invention can have enhanced resistance to alpha rays without capacitances being increased and maintain a fast speed of circuit operation.

7 Claims, 3 Drawing Sheets

SEMICONDUCTOR INTEGRATED CIRCUIT DEVICE WITH ALPHA RAYS RESISTANCE

This application is a continuation of application Ser. No. 07/661,438, filed Feb. 25, 1991, abandoned.

BACKGROUND OF THE INVENTION

The present invention relates to a semiconductor integrated circuit device and, in particular, a bipolar integrated circuit device having resistance to alpha rays.

Alpha rays are generated by the nuclear decay of radioactive elements contained in such as wiring materials. When those rays enter into a semiconductor integrated circuit device, pairs of electrons and holes are generated so that collection of the electrons occurs due to causes such as funneling phenomenon. The electron collection may cause unexpected currents so that software errors may occur.

In order to reduce the electron collection, there has been employed a technique by which the concentration of impurity atoms of a semiconductor substrate is increased. This technique, however, increases capacitances of the semiconductor integrated circuit device, thereby deteriorating the operation speed of the device.

SUMMARY OF THE INVENTION

It is, therefore, an object of the present invention to overcome the problems existing in the conventional arrangements and to provide an improved semiconductor integrated circuit device.

It is another object of the present invention to provide a semiconductor integrated circuit device which has resistance against alpha rays without the capacitance being increased.

It is a further object of the present invention to provide a semiconductor integrated circuit device which maintains a high speed of circuit operation.

In carrying out the above and other objects of the present invention in one form, there is provided an improved semiconductor integrated circuit device comprising:

a semiconductor substrate of a first conductivity type;

a first semiconductor layer of the first conductivity type having a high concentration of impurity atoms which layer is formed on a predetermined area of the semiconductor substrate;

a second semiconductor layer of the first conductivity type having a low concentration of impurity atoms which is formed on the first semiconductor layer;

a third semiconductor layer of a second conductivity type having a high concentration of impurity atoms which layer is not directly in contact with the first semiconductor layer; and a fourth semiconductor layer of the second conductivity type having a low concentration of impurity atoms which layer is formed on the third semiconductor layer.

BRIEF DESCRIPTION OF THE DRAWINGS

The above and other objects, features and advantages of the present invention will be apparent from the following description of preferred embodiments according to the invention explained with reference to the accompanying drawings, in which.

PREFERRED EMBODIMENTS OF THE INVENTION

Throughout the following explanation, similar reference symbols or numerals refer to the same or similar elements in all the figures of the drawings.

Figure 1:
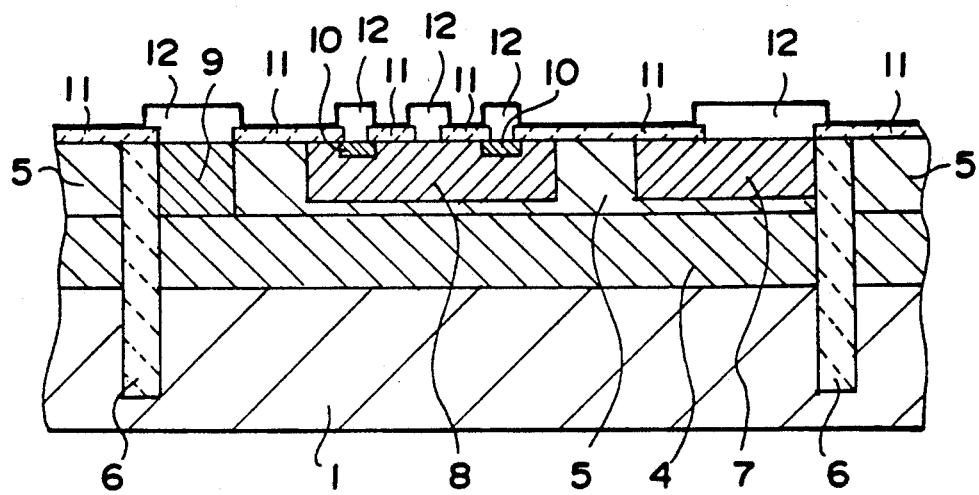
FIG. 1 shows a sectional view of a typical and conventional bipolar memory cell.

For the purpose of assisting in the understanding of the present invention, a conventional bipolar memory cell as a typical semiconductor integrated circuit device will first be described with reference to FIG. 1 before the present invention is explained.

Conventionally, a bipolar memory cell is such that on a semiconductor substrate 1 of one conductivity type, for example, a P-type silicon substratel, there is formed an N-type epitaxial layer 5 having a low concentration of impurity atoms with an N-type buried layer 4 having a high concentration of impurity atoms being interposed therebetween. On the N-type epitaxial layer 5, there are formed a P-type base region 8 having a high concentration of impurity atoms for a vertical NPN-transistor and a P-type emitter region 7 having a high concentration of impurity atoms for a lateral PNP-transistor, both of which regions are formed by means of selective diffusion of P-type impurity atoms.

In the conventional bipolar memory cell, moreover, there exists an N-type emitter region 10 having a high concentration of impurity atoms and an N-type collector region 9 having a high concentration of impurity atoms for the vertical NPN-transistor, both of which regions are made by means of diffusing N-type impurity atoms into a polycrystalline silicon. Electrodes 12 are formed at contact holes which open at predetermined locations in a SiO₂ film 11. Insolation regions 6 penetrate the P-type semiconductor layer 2 having a high concentration of impurity atoms from a surface of the N-type epitaxial layer 5 thereby separating cells from one another.

Alpha rays are generated by the nuclear decay of radioactive elements contained in such as wiring materials. When those rays enter into a junction portion of the P-type silicon substrate 1 and the N-type buried layer 4 having a high concentration of impurity atoms, pairs of electrons and holes are generated. As the N-type buried layer 4 is biased positively with respect to the P-type silicon substrate 1, there occurs the collection of electrons to the N-type buried layer 4 having a high concentration of impurity atoms. At the same time, there occurs a funneling phenomenon, that is, collection of electrons generated by the depletion layer widening which develops along the incident trace of the alpha rays. This increases the amount of electrons collecting to the N-type buried layer 4 having a high concentration of impurity atoms. Electric currents to the collector electrodes of the memory cell are generated due to this electron collection so that the state of a flip-flop circuit may be inverted. This results in a problem of software error.

As an attempt to enhance the resistance against alpha rays in order to suppress funneling phenomenon, there has been employed the technique by which the concentration of impurity atoms in the P-type silicon substrate 1 is increased to reduce the widening of the depletion layer and to decrease electron collection to the N-type buried layer 4 having a high concentration of impurity atoms.

In the conventional bipolar memory cell explained above, the concentration of impurity atoms in the semiconductor substrate has to be increased in order to enhance the resistance to alpha rays so that the conventional cell has a problem that the capacitances of the memory cell portion also increase. This results in a slow speed of reading and writing information.

Now, embodiments of the present invention will be described in detail with reference to FIGS. 2(a), 2(b) to FIGS. 5(a), 5(b).

Figure 2A:
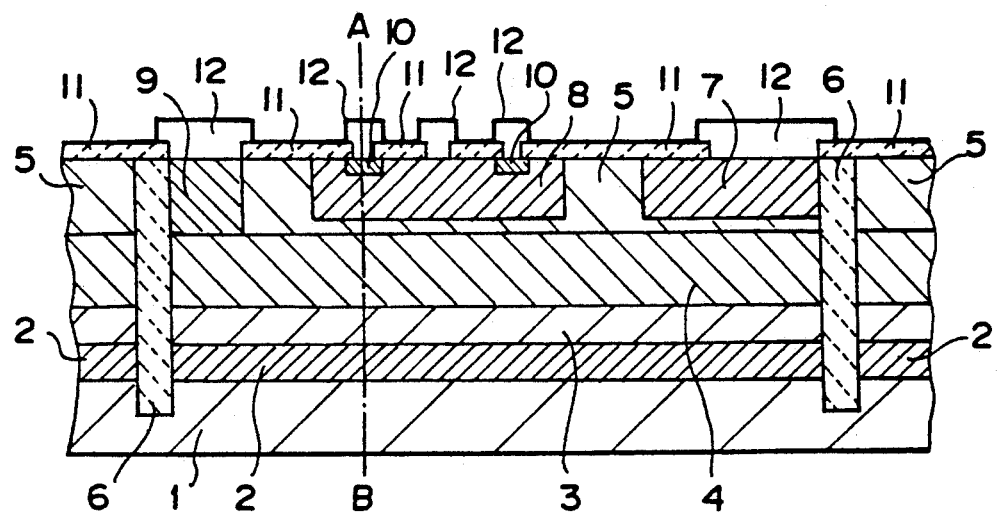
FIG. 2(a) shows a sectional view of a bipolar memory cell as a first embodiment according to the present invention.

FIG. 2(a) shows a sectional view of a bipolar memory cell as a first embodiment according to the present invention. On a semiconductor substrate having one type of conductivity, for example, a P-type silicon substrate 1, a P-type semiconductor layer 3 having a low concentration of impurity atoms is formed through a P-type semiconductor layer 2 having a high concentration of impurity atoms. An N-type semiconductor layer 5 having a low concentration of impurity atoms is placed with epitaxial growth on the P-type semiconductor layer 3 having a low concentration of impurity atoms through an N-type buried layer 4 having a high concentration of impurity atoms. On the N-type semiconductor layer 5, there is formed a P-type base region 8 having a high concentration of impurity atoms for a vertical NPN-transistor and a P-type emitter region 7 having a high concentration of impurity atoms for a lateral PNP-transistor both of which regions are formed by means of selective diffusion of P-type impurity atoms.

In the bipolar memory cell according to the present invention, moreover, there are formed an N-type emitter region 10 having a high concentration of impurity atoms and and N-type collector region 9 having a high concentration of impurity atoms for the vertical NPN-transistor both of which regions are made by means of diffusing N-type impurity atoms into a polycrystalline silicon. Electrodes 12 are formed at contact holes which open at predetermined locations in a SiO2 film 11. Insolation regions 6 penetrate the P-type semiconductor layer 2 having a high concentration of impurity atoms from a surface of the N-type epitaxial layer 5 in order to separate cells from one another.

The P-type base region 8 having a high concentration of impurity atoms for the vertical NPN-transistor also functions as a P-type collector region having a high concentration of impurity atoms for the lateral PNP-transistor. The N-type epitaxial layer 5 also serves as a base region for the lateral PNP-transistor.

Figure 2B:
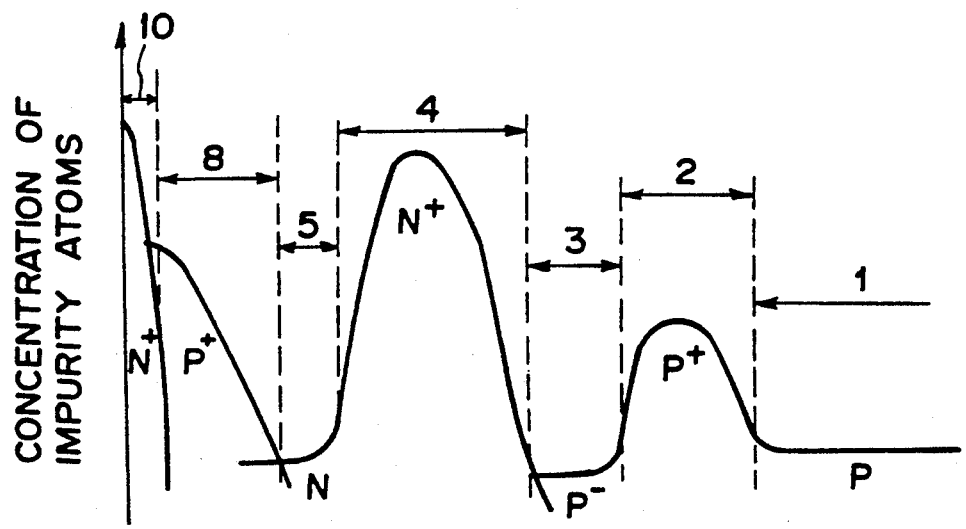
FIG. 2(b) illustrates a profile of impurity atom concentration in the first embodiment shown in FIG. 2(a)

FIG. 2(b) illustrates a profile of impurity atom concentration in the first embodiment taken along the line A-B illustrated in FIG. 2(a).

According to this embodiment, the P-type semiconductor layer 3 with a low concentration of impurity atoms has such a thickness that a depletion layer cannot reach the P-type semiconductor layer 2 with a high concentration of impurity atoms. When a reverse bias of 1.6 V is applied between the P-type silicon substrate 1 and the N-type buried layer 4 having a high concentration of impurity atoms, since the thickness of the depletion layer is about 0.7 μm the thickness of the P-type semiconductor layer 3 needs to be about 1 μm.

Next, main steps of the fabricating process of the bipolar memory cell according to the present invention will be described with reference to the appended drawings.

Figure 3A:
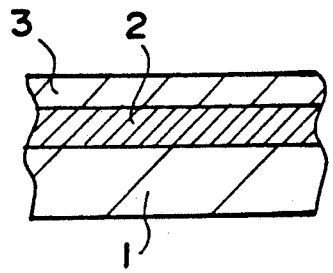
FIGS. 3(a) and 3(b) show sectional views of the bipolar memory cell of the first embodiment in the main steps of a fabricating process thereof.
Figure 3B:
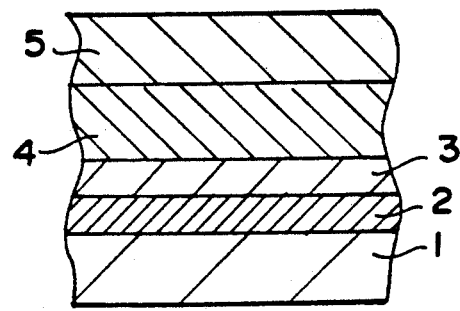

FIGS. 3(a) and 3(b) show sectional views of the bipolar memory cell of the first embodiment on the main steps of the fabricating process thereof. The P-type semiconductor layer 2 with its thickness of 0.5 μm having a high concentration of impurity atoms, the P-type semiconductor layer 3 with its thickness of 1.5 μm having a low concentration of impurity atoms, the N-type buried layer 4 with its thickness of 1.5 μm having a high concentration of impurity atoms and the N-type epitaxial layer 5 with its thickness of 1.0 μm having a low concentration of impurity atoms are continuously formed on the P-type silicon substrate 1 by means of the MBE (molecular beam epitaxial) method. The MBE method enables to control sufficiently under low temperature the concentration of impurity atoms in the layers to be homogeneous and the thickness thereof to be uniform.

Then, there are formed grooves (not shown in the figure) penetrating the P-type semiconductor layer 2 having a high concentration of impurity atoms from the surface of N-type epitaxial layer 5. The grooves are buried with polycrystalline silicon or dielectric material so that isolation regions 6 are formed.

Next, the P-type base region 8 having a high concentration of impurity atoms for the vertical NPN-transistor, the P-type emitter region 7 having a high concentration of impurity atoms for the lateral PNP-transistor, the N-type collector region 9 having a high concentration of impurity atoms, the N-type emitter region 10 having a high concentration of impurity atoms for the vertical NPN-transistor, the SiO2 film 11 and the electrodes 12 are formed respectively and this is how the bipolar memory cell shown in FIG. 2(a) is fabricated.

Now, a second embodiment according to the present invention is explained with reference to the appended drawings.

Figure 4:
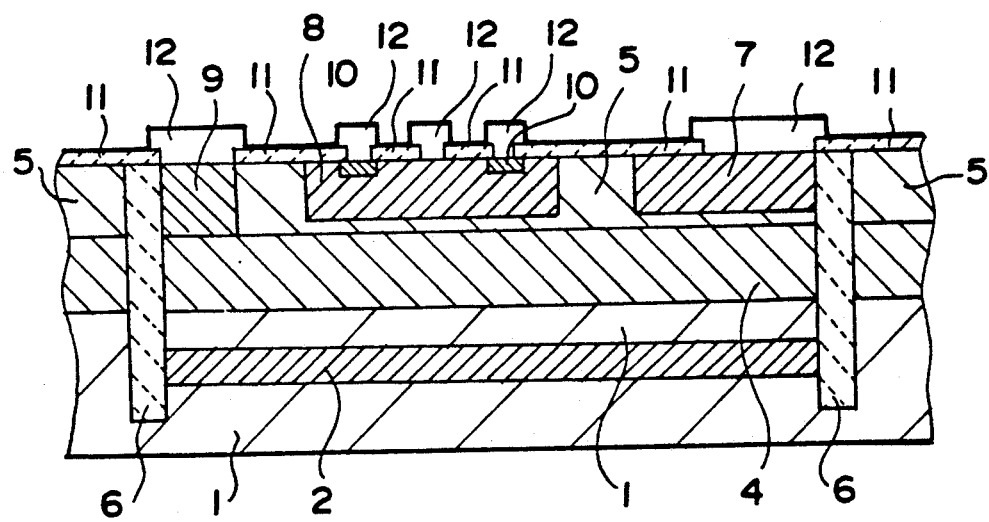
FIG. 4 shows a sectional view of a bipolar memory cell as a second embodiment according to the present invention.

FIG. 4 shows a sectional view of a bipolar memory cell as a second embodiment. The difference from the first embodiment is that, in this second embodiment, the P-type semiconductor layer having a high concentration of impurity atoms is formed only in a limited area such a memory cell portion and a peripheral circuit portion requiring a resistance to alpha rays. According to this structure, a peripheral circuit portion which requires high speed operation but does not require the resistance to alpha rays can maintain a small capacitance, so that it is possible to avoid high speed operation being sacrificed.

Figures 5A, 5B:
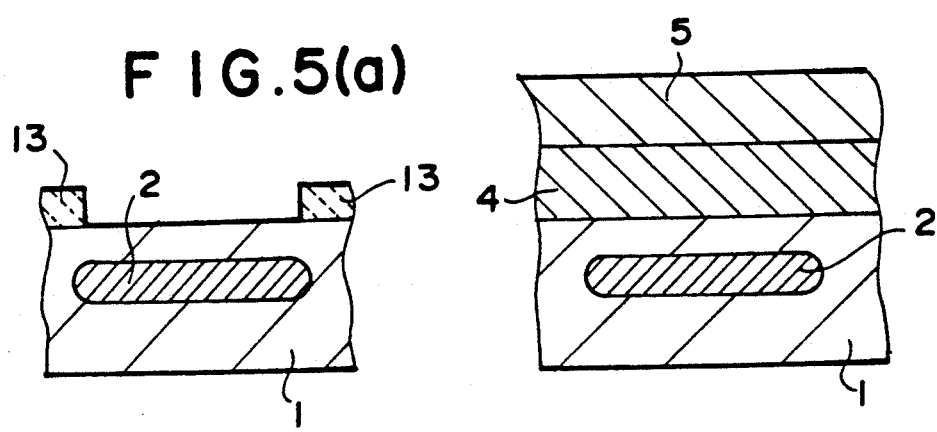
FIGS. 5(a) and 5(b) show sectional views of the bipolar memory cell of the second embodiment in the main steps of a fabricating processss thereof.

Next, main steps of the fabricating process of the second embodiment of the present invention is described hereinafter with reference to FIGS. 5(a) and 5(b).

A mask pattern 13 of an oxide film used for ion implantation is formed on a P-type silicon substrate 1. Boron having an energy greater than 400 keV is implanted through the mask pattern into the P-type silicon substrate 1, so that a P-type semiconductor layer 2 having a high concentration of impurity atoms is formed at the desired area having its depth of not less than 1 μm from the surface of the P-type silicon substrate 1. In this embodiment, the P-type silicon substrate 1 also plays the role of the P-type semiconductor layer 3 having a low concentration of impurity atoms in the first embodiment.

After the mask pattern 13 of the oxide film is removed from the surface of the P-type silicon substrate 1, an N-type buried layer 4 having a high concentration of impurity atoms and an N-type epitaxial layer 5 having a low concentration of impurity atoms are formed respectively on the surface thereof. Manufacturing processes of a memory cell portion and an isolation region are the same as those in the first embodiment.

While the present invention has been described in the bipolar memory cell as the embodiments, it is to be understood that the present invention can be applied to a bipolar integrated circuit in a Bi-CMOS integrated circuit with proper selection being made of the conductivity type of such as a semiconductor substrate and a buried layer.

According to the present invention, as mentioned above, the area in the bipolar integrated circuit device which area needs a resistance to alpha rays can have the P-type semiconductor layer having a high concentration of impurity atoms which layer is formed on or in the P-type silicon substrate with a depth of at least 1 $\mu$m from immediately beneath the N-type buried layer having a high concentration of impurity atoms in the area. Therefore, the area can have a resistance to alpha rays without an increase of capacitance between the bipolar memory cell and the substrate, so that it is possible to maintain a high speed of reading and writing information.

Referring back to FIG. 2(b), maintaining of the resistance to alpha rays is described. The concentration of impurity atoms in the P-type semiconductor layer 2 decreases as the depth increases, so that an electric field is generated in the direction opposite to that along the depth. This electric field prevents the diffusion of the electrons, which are generated by alpha rays, from the P-type silicon substrate 1 to the N-type buried layer 4 having a high concentration of impurity atoms. This results in the decrease of the electrons collecting to the N-type buried layer 4 having a high concentration of impurity atoms.

As each of the isolation regions 6 penetrates the P-type semiconductor layer 2 having a high concentration of impurity atoms from the N-type epitaxial layer 5, it prevents the lateral diffusion of the electrons, which are generated by alpha rays, in the intermediate layer of a P-type semiconductor (the P-type semiconductor layer 3 having a low concentration of impurity atoms in the first embodiment, or the P-type silicon substrate 1 in the second embodiment) disposed between the N-type buried layer 4 having a high concentration of impurity atoms and the P-type semiconductor layer 2 having a high concentration of impurity atoms. The P-type semiconductor layer 2 having a high concentration of impurity atoms reduces the widening of a depletion layer caused by funneling phenomenon and decreases the generation of electrons due to funneling phenomenon, so that there further decreases the amount of the electron collection to the N-type buried layer 4 having a high concentration of impurity atoms.

Therefore, the semiconductor integrated circuit device of the present invention can reduce the amount of the electron collection to the N-type buried layer having a high concentration of impurity atoms, so that it is possible to decrease the potential fluctuation caused by the incidence of alpha rays in the memory cell or, for example, to prevent the memory cell state from inverting unexpectedly.

While the preferred embodiments of the present invention have been shown and described, it is to be understood that those disclosures are for the purpose of illustration and the words which have been used are words of description rather than limitation, and that various changes and modifications may be made without departing from the scope of the present invention as set forth in the appended claims.

What is claimed is:

1. A semiconductor integrated circuit device having alpha rays resistance, said device comprising:
    a semiconductor substrate of a first conductivity type;
    a first semiconductor layer of said first conductivity type having a high concentration of impurity atoms, said layer being formed on a predetermined area of said semiconductor substrate;
    a second semiconductor layer of said first conductivity type having a low concentration of impurity atoms, said layer being formed on said first semiconductor layer;
    a third semiconductor layer of a second conductivity type having a high concentration of impurity atoms, said layer being formed on said second semiconductor layer and being separated from said first semiconductor layer by said second semiconductor layer;
    a fourth semiconductor layer of said second conductivity type having a low concentration of impurity atoms, said layer being formed on said third semiconductor layer; and
    at least one isolation region which extends from a surface of said fourth semiconductor layer into said semiconductor substrate with said isolation region penetrating said first semiconductor layer.

2. A semiconductor integrated circuit device according to claim 1, wherein said first semiconductor layer is an ion-implanted layer and said second semiconductor layer is a part of said semiconductor substrate.

3. A semiconductor integrated circuit device according to claim 1, wherein said first semiconductor layer is a layer formed on the entire area of said semiconductor substrate.

4. A semiconductor integrated circuit device according to claim 1, wherein said first semiconductor layer is formed on a portion of said semiconductor substrate, said portion requiring resistance to alpha rays.

5. A semiconductor integrated circuit device according to claim 1, wherein said semiconductor integrated circuit device is a bipolar memory cell.

6. A semiconductor integrated circuit device according to claim 1, wherein said first conductivity type is a P-type and said second conductivity type is an N-type.

7. A semiconductor integrated circuit device according to claim 1, wherein said second semiconductor layer has a thickness of at least 1 $\mu$m.

* * * * *